(12) United States Patent
Shakudo

(10) Patent No.: US 11,680,646 B2
(45) Date of Patent: Jun. 20, 2023

(54) FLUID CONTROL VALVE, FLUID CONTROL DEVICE, VALVE ELEMENT, AND METHOD OF MANUFACTURING VALVE ELEMENT

(71) Applicant: HORIBA STEC, Co., Ltd., Kyoto (JP)

(72) Inventor: Kazuya Shakudo, Kyoto (JP)

(73) Assignee: HORIBA STEC, Co., Ltd., Kyoto (JP)

( * ) Notice: Subject to any disclaimer, the term of this patent is extended or adjusted under 35 U.S.C. 154(b) by 0 days.

(21) Appl. No.: 17/648,093

(22) Filed: Jan. 14, 2022

(65) Prior Publication Data
US 2022/0228665 A1 Jul. 21, 2022

(30) Foreign Application Priority Data

Jan. 19, 2021 (JP) .............................. JP2021-006276

(51) Int. Cl.
| | |
|---|---|
| F16K 1/36 | (2006.01) |
| F16K 1/42 | (2006.01) |
| F16K 1/44 | (2006.01) |
| F16K 31/00 | (2006.01) |
| F16K 31/12 | (2006.01) |
| F16K 17/04 | (2006.01) |
| F16K 25/00 | (2006.01) |
| H01L 21/67 | (2006.01) |

(Continued)

(52) U.S. Cl.
CPC .................. *F16K 1/36* (2013.01); *F16K 1/42* (2013.01); *F16K 1/44* (2013.01); *F16K 3/0218* (2013.01); *F16K 17/04* (2013.01); *F16K 25/005* (2013.01); *F16K 31/007* (2013.01); *F16K 31/12* (2013.01); *H01L 21/67017* (2013.01); *F16K 11/074* (2013.01)

(58) Field of Classification Search
CPC ..... F16K 1/36; F16K 1/42; F16K 1/44; F16K 31/007; F16K 31/12; F16K 17/04; F16K 25/005; F16K 11/074; F16K 3/0218; H01L 21/67017
See application file for complete search history.

(56) References Cited

U.S. PATENT DOCUMENTS

| | | | |
|---|---|---|---|
| 8,967,200 B2 * | 3/2015 | Hayashi .................... | F16K 1/34 137/625.33 |
| 10,364,897 B2 * | 7/2019 | Vu ............................ | F16K 1/54 |

(Continued)

FOREIGN PATENT DOCUMENTS

JP 2017190872 A 10/2017

*Primary Examiner* — Patrick C Williams
(74) *Attorney, Agent, or Firm* — Alleman Hall Creasman & Tuttle LLP

(57) ABSTRACT

To avoid formation of surface sag formed when an internal flow path of a valve element is processed and to ensure a maximum flow rate in a fluid control valve where a seating surface of the valve element is formed of a resin layer, in a fluid control valve that includes a valve seat, and a valve element including resin layers provided in concave grooves formed on a facing surface facing the valve seat, the valve element further includes internal flow paths whose inflow ports are opened in a back surface facing away from the facing surface and whose outflow ports are opened in portions around the concave grooves on the facing surface, and counterbored portions are formed on sides of the inflow ports of the internal flow paths.

12 Claims, 12 Drawing Sheets

(51) Int. Cl.
*F16K 3/02* (2006.01)
*F16K 11/074* (2006.01)

(56) References Cited

U.S. PATENT DOCUMENTS

2017/0009890 A1* 1/2017 Vu ........................ F16K 41/103
2019/0292622 A1* 9/2019 Garat ....................... C21D 9/46

* cited by examiner

FLUID CONTROL VALVE, FLUID CONTROL DEVICE, VALVE ELEMENT, AND METHOD OF MANUFACTURING VALVE ELEMENT

BACKGROUND

Technical Field

The present invention relates to a fluid control valve, a fluid control device, a valve element, and a method of manufacturing a valve element.

Related Art

There is a valve element that is a component of a fluid control valve. A seating surface of this valve element is formed of a resin layer such as PFA to improve sealing performance between the valve element and a valve seat.

This valve element is made by denting the entire seating surface and forming a resin layer in the dent. However, when an additional attempt is made to form internal flow paths to handle an increase in flow rate, it is necessary that the internal flow paths penetrate the resin layer (JP 2017-190872 A). In this configuration, surface sag is formed when the internal flow paths are processed. This may lead to deterioration in production yield and leakage resistance performance. In some cases, the resin layer may flow into the internal flow paths, thus causing clogging.

PRIOR ART DOCUMENT

Patent Document

JP 2017-190872 A

SUMMARY

Therefore, the inventors of the present application conceived an interim configuration during development of the present invention. In this interim configuration, the entire seating surface is not dented, which is different from the conventional configuration as illustrated in FIG. 11. Rather, for example, multiple, annular concave grooves are concentrically formed so as to avoid openings of internal flow paths formed in the seating surface, as illustrated in FIG. 12. Then, resin layers are provided in these concave grooves.

An assumption was made regarding this configuration. That is, it would be possible to achieve a flow with a large flow rate because the multiple internal flow paths are formed while formation of surface sag is avoided because it is not necessary to penetrate the resin layers when the internal flow paths are processed.

However, the following fact was newly found. That is, in the configuration where the resin layers are provided in the annular concave grooves, a maximum flow rate is reduced after all, compared with the configuration where the resin layer is provided by denting the entire seating surface. This phenomenon occurs under a condition where the internal flow paths in both configurations have the same number.

The reason for this will be disclosed below.

The resin layers provided in the annular concave grooves described above are seated on a valve seat surface of a valve seat. Simultaneously, the resin layers functionally seal openings of internal flow paths formed in the valve seat. To allow the internal flow paths of the valve seat to have a certain diameter sufficient for reducing pressure loss in the valve seat, it is necessary that at least a width of each resin layer, that is, a width of each annular concave groove be wider than the diameter of each internal flow path.

In this case, regions between the annular concave grooves adjacent to each other on the seating surface have limitation in its width dimension. The internal flow paths of the valve element opened in these regions thus have a width dimension at least narrower than the width dimension of these regions. As a result, the internal flow paths of the valve element have the width dimension narrower than that of internal flow paths of the conventional valve element after all. Therefore, the maximum flow rate is reduced.

It is conceivable to increase the maximum flow rate by increasing the number of internal flow paths. However, this causes increases in production cost and man-hours, and a reduction in yield.

Therefore, the present invention has been made to wholly solve the above problems. It is a main object of the present invention to avoid formation of surface sag formed when an internal flow path of a valve element is processed in a fluid control valve where a seating surface of the valve element is formed of a resin layer. It is another main object of the present invention to ensure a maximum flow rate, in the fluid control valve.

That is, a fluid control valve according to the present invention is a fluid control valve that includes a valve seat, and a valve element including a resin layer provided in a concave groove formed on a facing surface facing the valve seat. In the fluid control valve according to the present invention, the valve element further includes at least one internal flow path whose inflow port is opened in a back surface facing away from the facing surface and whose outflow port is opened in a portion around the concave groove on the facing surface, and a counterbored portion is formed on a side of the inflow port of the internal flow path.

With this configuration, the at least one internal flow path formed in the valve element is opened in the portion around the concave groove on the facing surface. Thus, it is not necessary to penetrate the resin layer when the internal flow path is processed. Therefore, it is possible to avoid formation of surface sag. In addition, the counterbored portion is formed on the side of the inflow port of the internal flow path. Thus, it is possible to ensure a maximum flow rate. Further, the resin layer is not provided in the region where the internal flow path is opened in the facing surface. Thus, flatness of the region can be easily achieved, and sealing performance can be also improved.

To ensure the maximum flow rate, it is desirable to provide multiple internal flow paths in the valve element as many as possible. However, provision of counterbored portions in all the internal flow paths may increase processing cost and man-hours.

To reduce the increases in the processing cost and the man-hours and to more noticeably exhibit operation and effect brought by the counterbored portion, the valve element preferably includes at least one first internal flow path as the at least one internal flow path described above, and at least one second internal flow path as the at least one internal flow path described above. The second internal flow path is longer than the first internal flow path. The counterbored portion is preferably formed in the second internal flow path while the counterbored portion is not formed in the first internal flow path.

With this configuration, the counterbored portion is provided in the second internal flow path, which has higher resistance to a fluid. Thus, it is possible to more noticeably exhibit the operation and effect brought by the counterbored portion while the increases in the processing cost and the man-hours are reduced.

The specific configuration in which one internal flow path (the at least one second internal flow path) is longer than the other internal flow path (the at least one first internal flow path), as described above, includes the following configuration. That is, the back surface of the valve element is provided with a protrusion portion having a thickness dimension larger than a thickness dimension of a portion around the protrusion portion, where the thickness dimension is a dimension along a direction orthogonal to the back surface. Then, the first internal flow path penetrates the portion around the protrusion portion, and the second internal flow path penetrates the protrusion portion.

A fluid control valve, which is of a normally-closed type, is provided with a valve element return spring, which is adapted to bias a valve element toward a valve seat. For example, the valve element return spring has an annular shape. A protrusion portion is provided on a central portion of the valve element, and is fitted into an opening of the valve element return spring.

Therefore, it is preferable to further include a valve element return spring having an annular shape for biasing the valve element toward the valve seat, thus allowing the protrusion portion to be fitted into the valve element return spring.

With this configuration, it is possible to more noticeably exhibit the operation and effect brought by the counterbored portion while increases in processing cost and man-hours are reduced, in the normally-closed type fluid control valve.

A more specific embodiment includes the following one. That is, a plurality of first internal flow paths, each identical to the at least one first internal flow path described above, is provided while a plurality of second internal flow paths, each identical to the at least one second internal flow path described above, is also provided. Then, a plurality of outflow ports of the plurality of first internal flow paths and a plurality of outflow ports of the plurality of second internal flow paths are concentrically disposed on the facing surface.

To ensure processability of the counterbored portion, the counterbored portion preferably has a rotating body shape whose rotational axis passes through centers of the inflow port and the outflow port.

With this configuration, it is possible to use a central axis set when the at least one internal flow path is processed as the central axis of the counterbored portion, thus achieving excellent processability.

To more reliably ensure the maximum flow rate, the single counterbored portion is formed in a straddling manner over a plurality of internal flow paths each identical to the at least one internal flow path described above.

With this configuration, a volume of this counterbored portion becomes larger than that of a counterbored portion having a one-to-one correspondence to each of the internal flow paths. Thus, it is possible to more reliably ensure the maximum flow rate.

A ratio of a length of the counterbored portion to a total length of the at least one internal flow path is preferably 55% or more to 80% or less.

With this configuration, the maximum flow rate can be increased while the number of internal flow paths is suppressed to a conventional number of the internal flow paths. Detailed analysis data will be described later.

The resin layer is preferably formed of a crosslinked modified fluorine-based resin.

A fluid control device according to the present invention includes the fluid control valve described above.

A valve element according to the present invention is a valve element that forms a fluid control valve along with a valve seat, and that includes a resin layer provided in a concave groove formed on a facing surface facing the valve seat. The valve element further includes at least one internal flow path whose inflow port is opened in a back surface facing away from the facing surface and whose outflow port is opened in a portion around the concave groove on the facing surface. A counterbored portion is formed on a side of the inflow port of the internal flow path.

A method of manufacturing a valve element according to the present invention is a method of manufacturing a valve element that forms a fluid control valve along with a valve seat. The method includes the following steps: forming a concave groove on a facing surface facing the valve seat; providing a resin layer in the concave groove; forming at least one internal flow path whose inflow port is opened in a back surface facing away from the facing surface and whose outflow port is opened in a portion around the concave groove on the facing surface; and providing a counterbored portion on a side of the inflow port of the internal flow path.

According to the present invention configured as described above, in a fluid control valve where a seating surface of a valve element is formed of a resin layer, it is possible to avoid formation of surface sag formed when an internal flow path of the valve element is processed, and it is possible to ensure a maximum flow rate.

DETAILED DESCRIPTION

Hereinafter, one embodiment of a fluid control device in which a fluid control valve according to the present invention is incorporated will be described with reference to the drawings.

Figure 1:
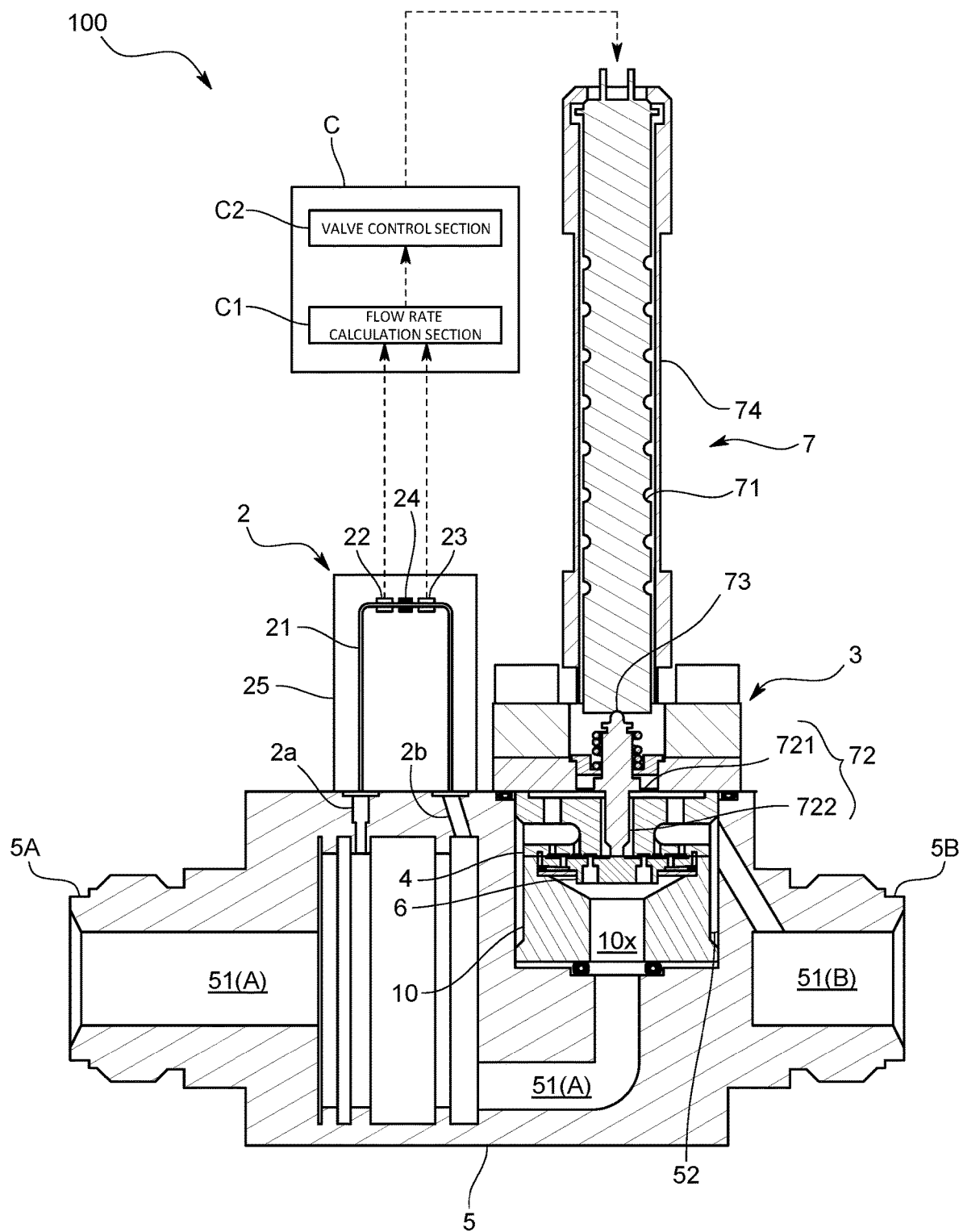
FIG. 1 is an overall vertical cross-sectional view illustrating a fluid control device according to one embodiment of the present invention.

As illustrated in FIG. 1, the fluid control device 100 according to the present embodiment is a mass flow controller used in, for example, a semiconductor manufacturing apparatus. The fluid control device includes a body 5, a flow rate sensing mechanism 2, the fluid control valve 3, and a control unit C. The body 5 has a flow path 51 formed therein, through which a fluid such as a gas or the like used for a semiconductor process flows. The flow rate sensing mechanism 2 senses a flow rate of the fluid flowing through the flow path 51 of the body 5. The fluid control valve 3 controls the flow rate of the fluid flowing through the flow path 51. The control unit C controls a valve opening degree of the fluid control valve 3 such that a measured flow rate output by the flow rate sensing mechanism 2 approaches a predetermined setting flow rate. Each of the components will be described in detail below.

The body 5 has a block shape through which the flow path 51 described above extends. An upstream end of the flow path 51, which serves as an upstream side port 5A, is connected to an external inflow pipe (not illustrated). A downstream end of the flow path 51, which serves as a downstream side port 5B, is connected to an external outflow pipe (not illustrated).

For the flow rate sensing mechanism 2, various types may be conceivable such as a thermal type, a differential pressure type, a Coriolis type, and an ultrasonic type. However, a so-called thermal type flow rate sensing mechanism is used in this embodiment. The thermal type flow rate sensing mechanism 2 includes a thin tube 21, a heater 24, and a pair of temperature sensors 22, 23. The thin tube 21 is connected in parallel to the flow path 51, and thus a predetermined portion of the fluid flowing through the flow path 51 is guided to the thin tube 21. The heater 24 is provided on the thin tube 21. The temperature sensors 22, 23 are provided so as to sandwich the heater 24. When the fluid flows through the thin tube 21, a temperature difference, which corresponds to a mass flow rate of the fluid, occurs between the two temperature sensors 22, 23. The flow rate sensing mechanism 2 is therefore configured to measure the flow rate based on this temperature difference.

In this embodiment, a configuration is made such that a casing 25 having an elongated shape is provided for housing the thin tube 21, the heater 24, the temperature sensors 22, 23, and an electric circuit peripheral to these components. An additional configuration is also made such that a pair of branched flow paths 2a, 2b branches off from the flow path 51 of the body 5, and that the casing 25 is attached to the body 5. With these configurations, an inlet port of the thin tube 21 is connected to the branched flow path 2a on the upstream side, and an outlet port of the thin tube 21 is connected to the branched flow path 2b on the downstream side. Note that the flow rate sensor is not limited to this type.

Physically, the control unit C is a computer including a central processing unit (CPU), a memory, and the like. Functionally, the control unit C includes a flow rate calculation section C1 and a valve control section C2. The flow rate calculation section C1 calculates a flow rate based on output values of the pair of temperature sensors 22, 23 described above. The valve control section C2 controls the valve opening degree of the fluid control valve 3 such that a calculated flow rate calculated by the flow rate calculation section C1 is compared to a predetermined target flow rate and the calculated flow rate approaches the target flow rate.

The fluid control valve 3 is of a normally-closed type, and is provided on the flow path 51. The fluid control valve 3 includes a valve seat member 4, a valve element member 6, and an actuator 7. The valve seat member 4 and the valve element member 6 are housed in the body 5. The actuator 7 is a driving mechanism, which drives the valve element member 6 and thus sets the valve opening degree, that is, a separation distance between the valve seat member 4 and the valve element member 6.

Figure 2:
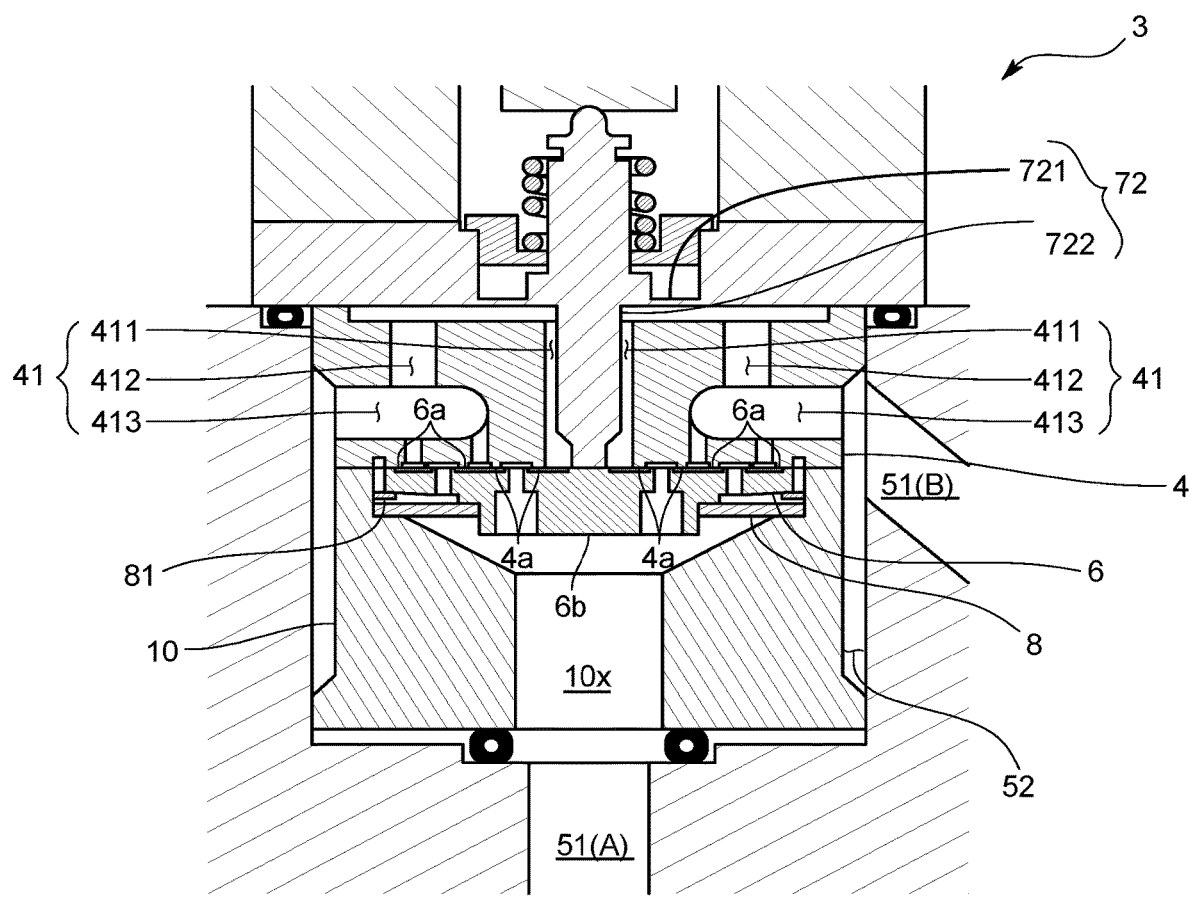
FIG. 2 is a vertical cross-sectional view illustrating a fluid control valve according to the embodiment.

The valve seat member 4 is a valve seat, and is made of metal (in this embodiment, stainless steel is used as a material, but besides that, a highly heat-resistant and corrosion-resistant alloy such as HASTELLOY (registered trademark) may be used). As illustrated in FIG. 2, the valve seat member 4 has a valve seat surface 4a, on a lower surface thereof, which protrudes toward a side of the valve element member 6. In the valve seat member 4, internal flow paths 41 are formed. For the material of the valve seat member 4, a highly heat-resistant and corrosion-resistant alloy such as HASTELLOY (registered trademark) may be used.

The internal flow paths 41 according to the present embodiment have three parts: a first internal flow path 411, second internal flow paths 412, and third internal flow paths 413. The first internal flow path 411 has one end that is opened in the valve seat surface 4a and the other end that is opened in an upper surface of the valve seat member 4. The second internal flow paths 412 each have one end that is opened in the upper surface of the valve seat member 4 and the other end that is opened in a side circumferential surface of the valve seat member 4. The third internal flow paths 413 each have one end that is opened in the valve seat surface 4a and the other end that is opened in the side circumferential surface of the valve seat member 4. Further, a drive shaft (an abutting shaft member 722) of the actuator 7, which will be described later, is inserted into the first internal flow path 411. The first internal flow path 411 and the second internal flow paths 412 communicate with each other through a space defined by a concave portion that is formed on the upper surface of the valve seat member 4 and a diaphragm member 721 that closes the concave portion. The second internal flow paths 412 and the third internal flow paths 413 communicate with each other inside the valve seat member 4. However, the configuration of these internal flow paths 411 to 413 is not limited to this, and may be appropriately modified.

Here, the one end of the first internal flow path 411 is opened in a central portion of the valve seat surface 4a. The one ends of the third internal flow paths 413 are opened at radially outer locations with respect to the central portion. In this embodiment, the multiple third internal flow paths 413 are provided, and the one end openings of these third internal flow paths 413 are opened at multiple locations in the valve seat surface 4a. More specifically, the one ends of the multiple third internal flow paths 413 are opened at radially outer locations with respect to the central portion of the valve seat surface 4a with a predetermined distance being maintained. The other one ends of the multiple third internal flow paths 413 are opened at further radially outer locations with respect to the radially outer locations in which the one ends of the multiple third internal flow paths 413 are opened, with a predetermined distance being maintained.

In the above configuration, the valve seat surface 4a is formed so as to avoid the one end opening of the first internal flow path 411 and the one end openings of the third internal flow paths 413. Specifically, the valve seat surface 4a is formed of multiple regions that are concentrically formed in annular shapes in plan view.

The valve seat member 4 is housed in a concave housing portion 52. The concave housing portion 52 has a columnar shape, and is provided in the body 5. The concave housing portion 52 is disposed so as to divide the flow path 51 of the body 5. Of parts of the flow path 51 divided by the concave housing portion 52, a flow path on the upstream side (hereinafter, also referred to as an upstream side flow path) 51(A) is opened, for example, to a central portion on a bottom of the concave housing portion 52, and a flow path on a downstream side of the concave housing portion 52 (hereinafter, also referred to as a downstream side flow path) 51(B) is, for example, opened to a side or the bottom of the concave housing portion 52.

In a state where the valve seat member 4 is housed in the concave housing portion 52, a gap is formed between the outer side circumferential surface of the valve seat member 4 and an inner side circumferential surface of the concave housing portion 52. Through this gap, the downstream side flow path 51(B) of the body 5 communicates with the internal flow paths 41.

The valve element member 6 is a valve element, and is arranged so as to face the valve seat member 4 in the concave housing portion 52 of the body 5. The valve element member 6 has a seating surface 6a on a surface (an upper surface) thereof. The seating surface 6a is adapted to be seated on the valve seat surface 4a of the valve seat member 4.

The valve element member 6 is driven by the actuator 7. With this driving, states of the valve element member 6 are shifted from a closed state to an opened state. Here, the closed state is a state in which the valve element member 6 is in contact with the valve seat member 4 and thus communication is blocked between the upstream side flow path 51(A) and the downstream side flow path 51(B). The opened state is a state in which the valve element member 6 is separated from the valve seat member 4 and thus the communication is made between the upstream side flow path 51(A) and the downstream side flow path 51(B). A direction along movement of the valve element member 6 from the closed state toward the opened state, that is, a direction in which a driving force of the actuator 7 acts on the valve element member 6 is defined as a valve opening direction. In contrast, a direction along the movement of the valve element member 6 from the opened state toward the closed state, that is, a direction opposite to the direction in which the driving force of the actuator 7 acts on the valve element member 6, is defined as a valve closing direction.

As illustrated in FIG. 1, the actuator 7 includes, for example, a piezo stack 71 and an actuating body 72. The piezo stack 71 is formed of multiple piezo elements, which are stacked on top of each other. The actuating body 72 is displaced by extension of the piezo stack 71.

The piezo stack 71 is housed in a casing member 74. The piezo stack 71 has a tip end portion that is connected to a protrusion 73, which is, for example, integrally provided in a base end portion of the actuating body 72. Alternatively, the protrusion 73 may be provided separately from the actuating body 72.

The actuating body 72 according to the present embodiment has the diaphragm member 721 and the abutting shaft member 722. The abutting shaft member 722 is provided in the center of the diaphragm member 721, and is passed through the center of the valve seat member 4 (the first internal flow path 411) to abut on the upper surface of the valve element member 6. When a predetermined, fully opening voltage is applied, the piezo stack 71 extends. Then, the actuating body 72 biases the valve element member 6 in the valve opening direction. As a result, the seating surface 6a is separated from the valve seat surface 4a, and thus the state is shifted to the opened state. Further, when a voltage lower than the fully opening voltage is applied, the valve seat surface 4a and the seating surface 6a are separated by a distance corresponding to a value of the voltage. Through the gap, the upstream side flow path 51(A) and the downstream side flow path 51(B) communicate with each other.

Further, a valve element return spring 8 is provided so as to be attached to and be in contact with the valve element member 6. The valve element return spring 8 is adapted to bias the valve element member 6 in the valve closing direction. The valve element return spring 8 causes the valve element member 6 to be in the closed state in a normal condition where no voltage is applied to the actuator 7.

The valve element return spring 8 has an annular shape. The valve element member 6 is provided with a protrusion portion 6z in a central portion thereof. The protrusion portion 6z is fitted into the valve element return spring 8. Specifically, the valve element return spring 8 is a plate spring that is supported by a spring guide member 10 housed in the concave housing portion 52 of the body 5. As illustrated in FIG. 2, the valve element return spring 8 is provided so as to be in contact with a back surface (a lower surface) 6b that faces away from the seating surface 6a of the valve element member 6. The valve element return spring 8 may be any elastic body other than the plate spring as long as the valve element return spring 8 biases the valve element member 6. The elastic body may directly or indirectly bias the valve element member 6. Further, in the present embodiment, a tilt restraining spring 81 is provided. The tilt restraining spring 81 is located on an upper side of the valve element return spring 8, and restrains a tilt of the valve element member 6. The tilt restraining spring 81 also has an annular shape. The tilt restraining spring 81 is in contact with the back surface 6b of the valve element member 6 at a location outside of the contact point between the valve element return spring 8 and the back surface 6b.

The spring guide member 10 has a substantially rotating body shape having a concave cross section, and is provided for supporting the spring 8 in the concave housing portion 52. The spring guide member 10 has a bottom wall in which an opening portion 10x is formed. The opening portion 10x communicates with the upstream side flow path 51(A) that is opened to the bottom of the concave housing portion 52. The spring guide member 10 also has a side circumferential wall whose upper end portion is in contact with a circumferential edge portion of the valve seat member 4. The valve element return spring 8 is provided on an inner side circumferential surface of the spring guide member 10. In the present embodiment, a configuration is made such that the valve element member 6 is housed in a space defined by the valve seat member 4 and the spring guide member 10. Further, the valve element member 6 is disposed so as to be spaced from the inner side circumferential surface of the spring guide member 10 at a predetermined interval. That is, an outer side circumferential surface of the valve element member 6 faces and is spaced from the inner side circumferential surface of the spring guide member 10.

Figure 3:
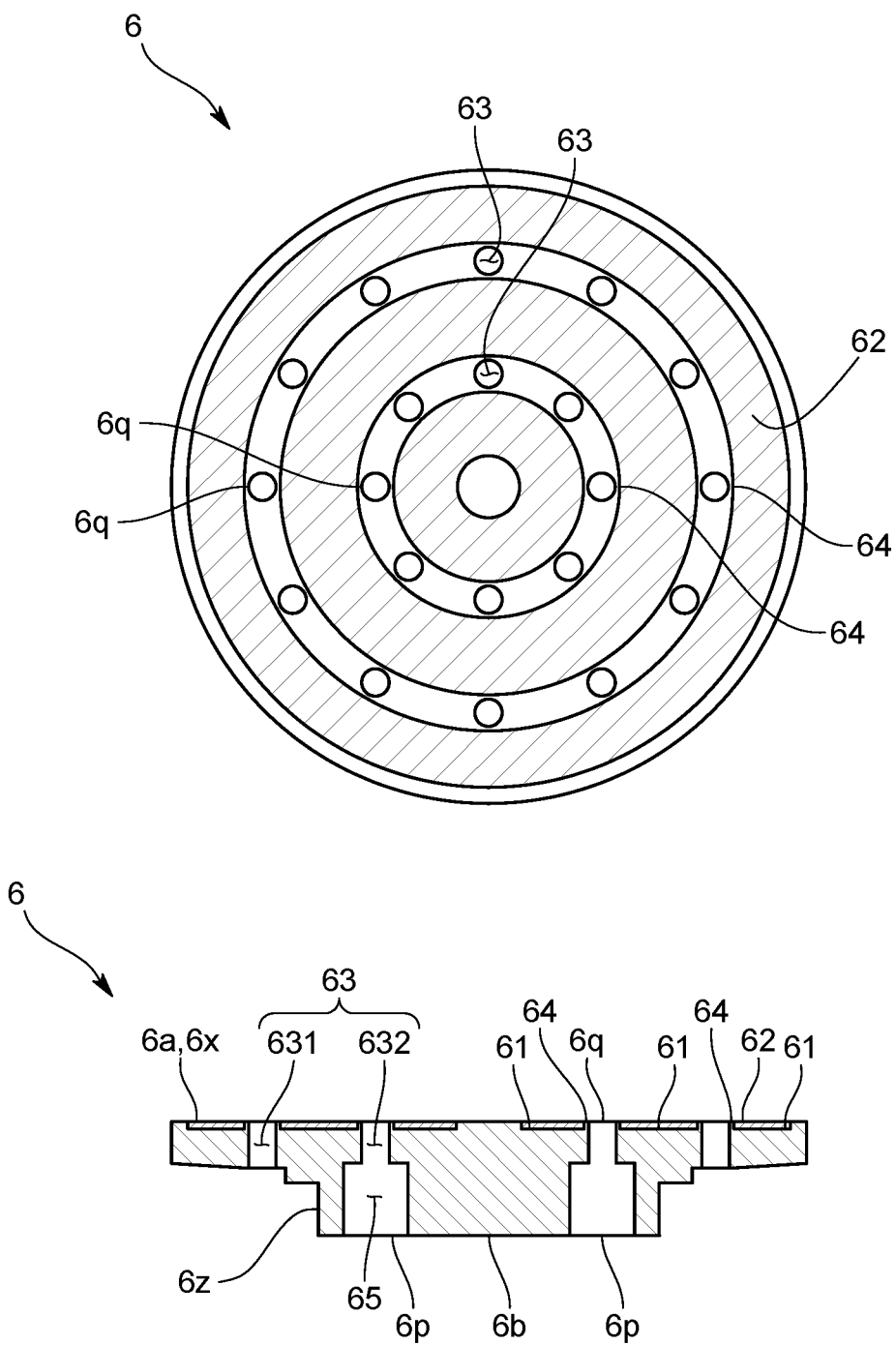
FIG. 3 is a plan view and a vertical cross-sectional view illustrating a valve element according to the embodiment.
Figure 4:
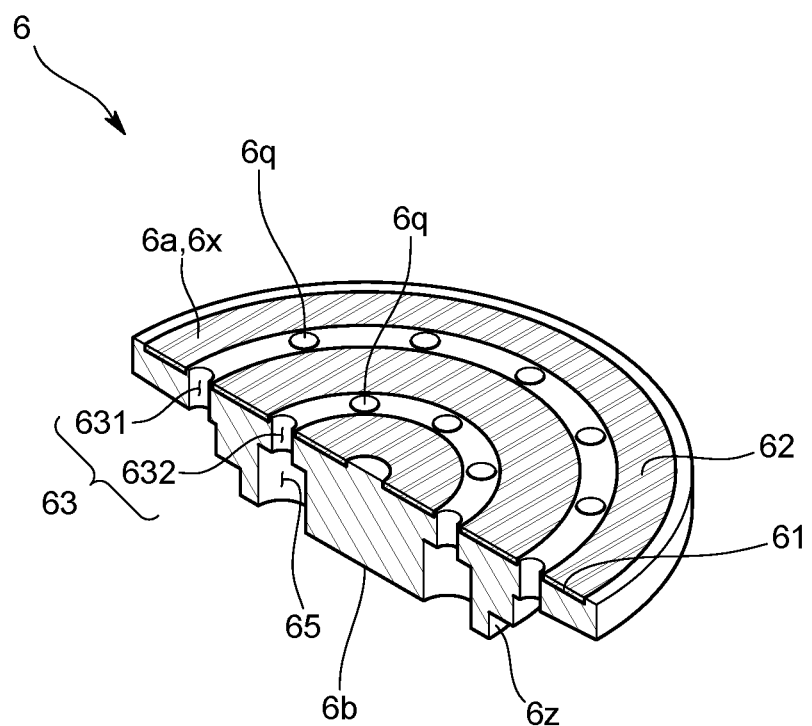
FIG. 4 is a perspective view illustrating the valve element according to the embodiment, as viewed from above.
Figure 5:
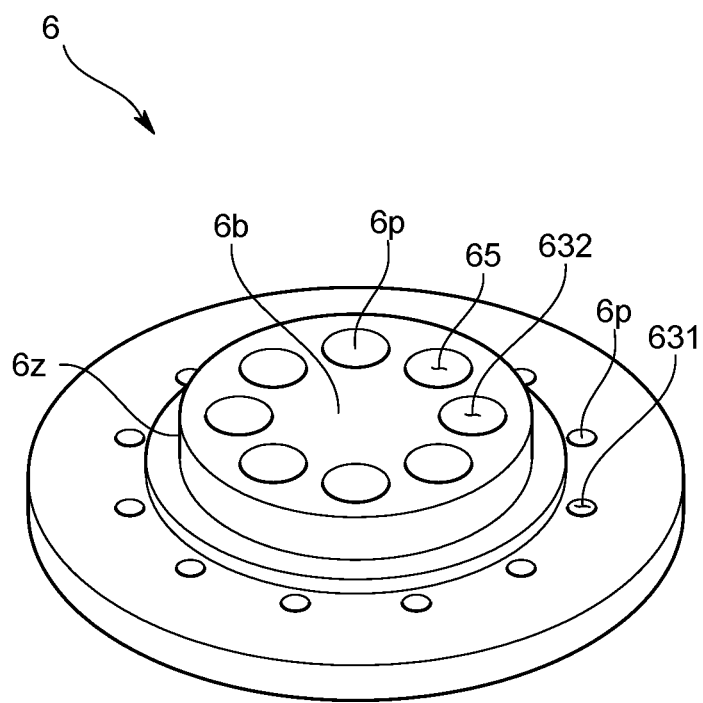
FIG. 5 is a perspective view illustrating the valve element according to the embodiment, as viewed from below.

In the above configuration, the valve element member 6 according to the present embodiment has concave grooves 61, resin layers 62, and internal flow paths 63, as illustrated in FIGS. 3 to 5. The concave grooves 61 are formed on a facing surface 6x (the upper surface) that faces the valve seat surface 4a of the valve seat member 4. The resin layers 62 are provided in the concave grooves 61, and are adapted to come into contact with the valve seat surface 4a of the valve seat member 4. The internal flow paths 63 each have an inflow port 6p opened in the back surface 6b, and an outflow port 6q opened in the facing surface 6x. The valve element member 6 is formed of a material having excellent heat resistance and corrosion resistance. In the present embodiment, the valve element member 6 is mainly formed of stainless steel. Alternatively, the valve element member 6 may be formed of a highly heat-resistant and corrosion-resistant alloy such as HASTELLOY (registered trademark).

The concave grooves 61 have shapes corresponding to the valve seat surface 4a. These shapes cover ranges including the regions of the valve seat surface 4a when the valve element member 6 is seated on the valve seat member 4. The concave grooves 61 according to the present embodiment have substantially annular shapes in plan view. The multiple concave grooves 61 are concentrically formed in this embodiment. Further, the concave grooves 61 have substantially U-shape cross sections, and a depth of each of the concave grooves 61 is 50 to 150 µm, for example.

Ridge portions 64 are formed between the concave grooves 61 adjacent to each other, and are also formed in a portion further outside of the concave groove 61 located on the outermost side in the radial direction. These ridge portions 64 have substantially annular shapes in plan view, and are formed concentrically with the concave grooves 61.

The resin layers 62 are formed in the concave grooves 61. The resin layers 62 each have a shape in plan view that is the same shape as a corresponding concave groove 61. In the present embodiment, the shapes in plan view of the resin layers 62 are substantially annular shapes. The resin layers 62 formed in the concave grooves 61 are adapted to come into contact with all the regions of the valve seat surface 4a. That is, upper surfaces of the resin layers 62 serve as the seating surface 6a. A film thickness of each of the resin layers 62 is the same as a depth of each of the concave grooves 61, and is 50 to 150 µm, for example. Since the film thickness of each of the resin layers 62 is the same as the depth of each of the concave grooves 61, an upper surface of each of the ridge portions 64 is flush with the upper surface of each of the resin layers 62. Further, the resin layers 62 are formed of, for example, a fluorine-based resin having excellent heat resistance, corrosion resistance, chemical resistance, and low friction characteristics. In the present embodiment, a crosslinked modified fluorine-based resin is used. Specifically, the resin layers 62 are formed of a Poly [tetrafluoroethylene-co-perfluoro (alkyl vinyl ether)] (PFA).

Each of the internal flow paths 63 is formed by penetrating a portion between the facing surface 6x and the back surface 6b of the valve element member 6. The inflow port 6p, of each of the internal flow paths 63, formed on the back surface 6b communicates with the upstream side flow path 51(A) and the opening portion 10x of the spring guide member 10, which are described above. The outflow port 6q, of each of the internal flow paths 63, formed on the facing surface 6x communicates with the internal flow paths 41 of the valve seat member 4 in the opened state where the seating surface 6a is separated from the valve seat surface 4a. The outflow ports 6q are formed so as not to overlap with the openings of the internal flow paths 41 formed on the valve seat surface 4a.

In the present embodiment, the inflow port 6p and the outflow port 6q of each of the internal flow paths 63 have a circular shape. Each of the internal flow paths 63 has a rotating body shape whose rotational axis passes through the centers of the inflow port 6p and the outflow port 6q. Specifically, the internal flow paths 63 have substantially columnar shapes.

Further, the valve element member 6 in this embodiment is provided with multiple internal flow paths 63. Specifically, the valve element member 6 is provided with first internal flow paths 631 and second internal flow paths 632. The second internal flow paths 632 have a flow path length longer than that of the first internal flow paths 631.

A more specific description is as follows. That is, the valve element member 6 is provided with the protrusion portion 6z on the back surface 6b as described above. A thickness dimension of the protrusion portion 6z is larger than a thickness dimension of a portion around the protrusion portion 6z. In this configuration, the multiple first internal flow paths 631 are provided in the portion around an outer circumferential portion of the protrusion portion 6z. The multiple second internal flow paths 632 are provided in the protrusion portion 6z. Here, the thickness dimension is a dimension along a direction orthogonal to the back surface 6b.

The outflow ports 6q of the first internal flow paths 631 are intermittently provided along a circumferential direction about the center of the seating surface 6a. In this embodiment, the outflow ports 6q of the first internal flow paths 631 are circumferentially disposed at equal intervals.

The outflow ports 6q of the second internal flow paths 632 are intermittently provided along the circumferential direction about the center of the seating surface 6a. In this embodiment, the outflow ports 6q of the second internal flow paths 632 are circumferentially disposed at equal intervals. These outflow ports 6q of the second internal flow paths 632 and the outflow ports 6q of the first internal flow paths 631 described above are concentrically disposed.

Further, the internal flow paths 63 according to the present embodiment have counterbored portions 65 formed on inflow port 6p sides thereof, as illustrated in FIGS. 3 to 5. Each of the counterbored portions 65 has a shape in which a flow path diameter on the inflow port 6p side (the upstream side) is larger than a flow path diameter on an outflow port 6q side (the downstream side).

In this embodiment, the counterbored portions 65 are formed in the second internal flow paths 632 while the counterbored portions 65 are not formed in the first internal flow paths 631 described above. That is, a cross-sectional shape of each of the first internal flow paths 631 is configured to be uniform from the inflow port 6p to the outflow port 6q. A cross-sectional shape of each of the second internal flow paths 632 is configured to be narrower on the way from the inflow port 6p to the outflow port 6q.

Each of the counterbored portions 65 has a substantially columnar shape, and is provided so as to individually correspond to each of the second internal flow paths 632. Each of the counterbored portions 65 has a function of reducing pressure loss of each of the second internal flow paths 632. That is, each counterbored portion 65 is a region having a cross-sectional area of a cross section, which is orthogonal to a flow path direction of the second internal flow path 632, larger than a cross-sectional area of the directionally same cross section on the downstream side of each second internal flow path 632. More specifically, a diametrical dimension (diameter) of the counterbored portion 65 is preferably twice or more as large as a diametrical dimension (diameter) on the downstream side of the counterbored portion 65 in the second internal flow path 632. That is, in this embodiment, a diametrical dimension of the inflow port 6p of the second internal flow path 632 is preferably twice or more as large as a diametrical dimension of the outflow port 6q.

Figure 6:
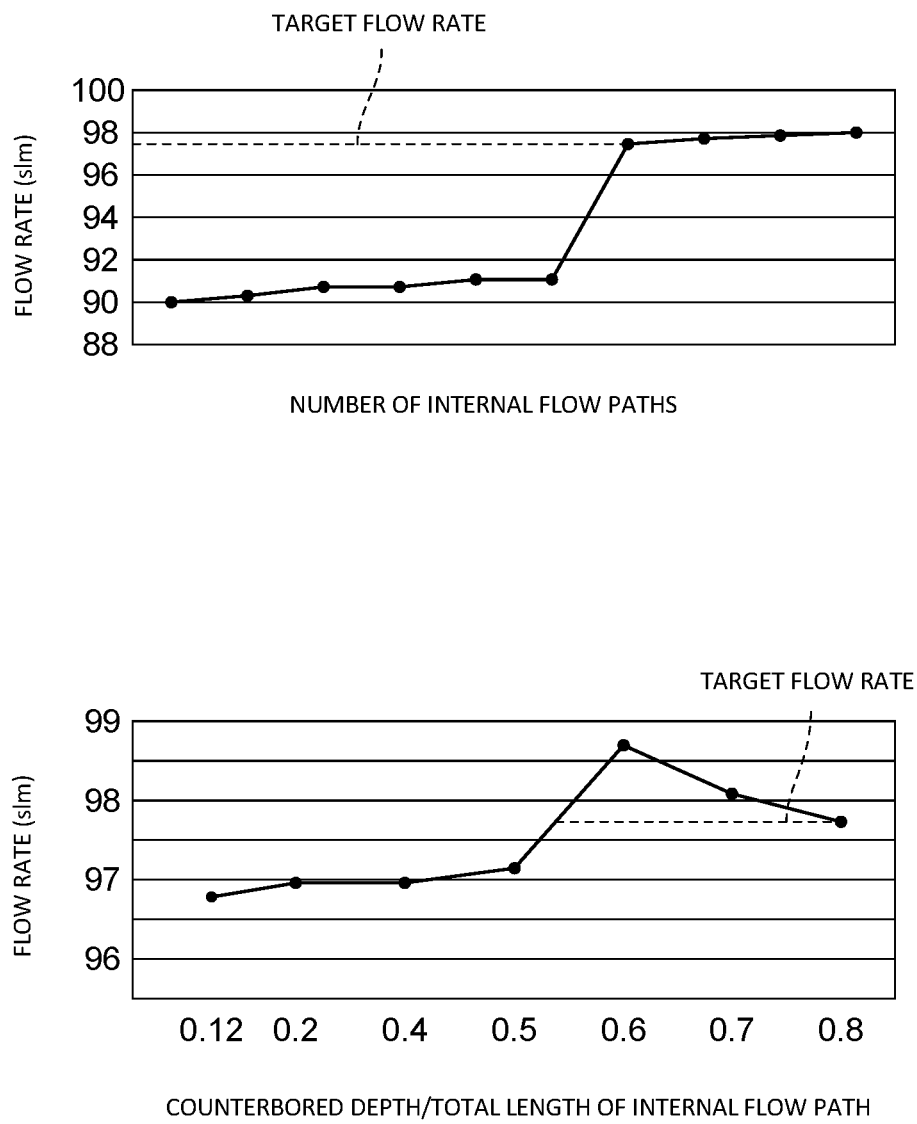
FIG. 6 is a diagram illustrating analysis data that shows operation and effect brought by a counterbored portion according to the embodiment.

As illustrated in an upper part of FIG. 6, when a conventional valve element member is used, that is, a configuration is made in which counterbored portions are not provided in internal flow paths, it can be found that a flow rate significantly increases after the internal flow paths have a certain number, as the number of internal flow paths is increased. However, to increase a maximum flow rate to a target flow rate, it is necessary to increase the number of internal flow paths. This leads to increases in production cost and man-hours, and a reduction in yield.

In contrast, as illustrated in a lower part of FIG. 6, when a ratio of a length of the counterbored portion 65 to a total length of the second internal flow path 632 is 55% or more to 80% or less, the maximum flow rate can be increased to the target flow rate described above or a flow rate equivalent to this target flow rate, without increasing the number of internal flow paths 63.

When the flow path length of the counterbored portion 65 is less than 55% of the total length of the second internal flow path 632, it is estimated that a speed of flow on the downstream side of the counterbored portion 65 becomes faster. Thus, pressure loss is estimated to increase because effect of the pressure loss due to friction between the fluid and an inner circumferential surface of the internal flow path 632 is proportional to the square of the speed of the flow. In contrast, when the flow path length of the counterbored portion 65 exceeds 80% of the total length of the second internal flow path 632, it is estimated that wall loss on an inner circumferential surface of the counterbored portion 65 becomes large, and thus the pressure loss in the second internal flow path 632 increases.

Figure 7:
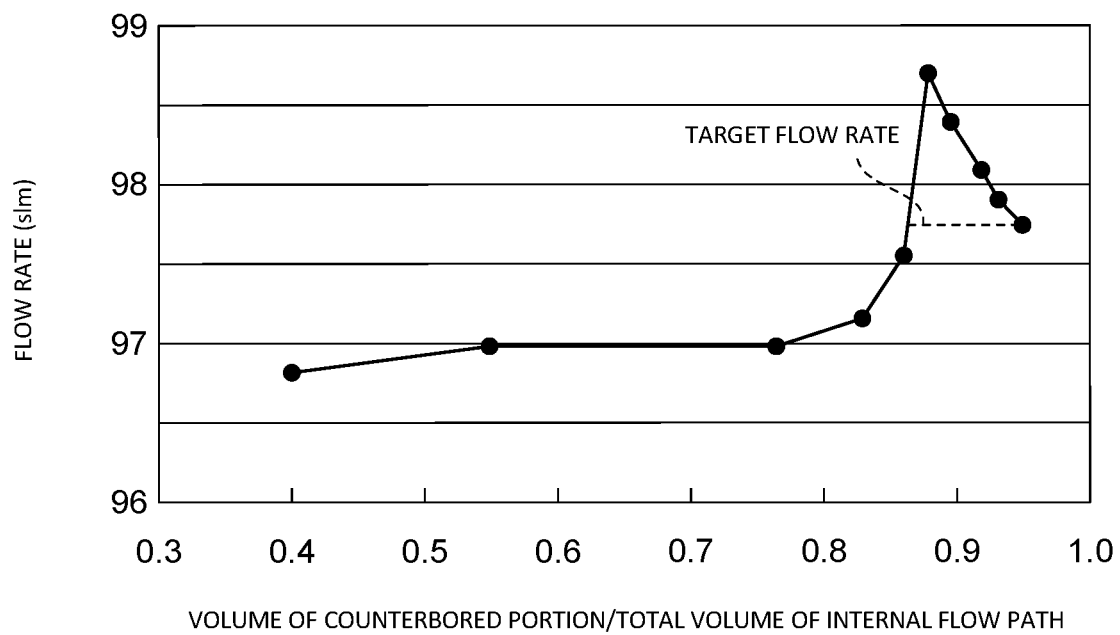
FIG. 7 is a diagram illustrating analysis data that shows another operation and effect brought by the counterbored portion according to the embodiment.

As illustrated in FIG. 7, when a ratio of a volume of the counterbored portion 65 to a total volume of the single second internal flow path 632 is 86% or more to 95% or less, it can be seen that the maximum flow rate is increased to the target flow rate described above or a flow rate equivalent to this target flow rate, without increasing the number of internal flow paths 63.

This phenomenon is also explained by a similar factor described above. That is, when the volume of the counterbored portion 65 is less than 86% of the total volume of the second internal flow path 632, it is estimated that the speed of the flow on the downstream side of the counterbored portion 65 becomes faster. Thus, the pressure loss is estimated to increase because the effect of the pressure loss due to the friction between the fluid and the inner circumferential surface of the internal flow path 632 is proportional to the square of the speed of the flow. When the volume of the counterbored portion 65 exceeds 95% of the total volume of the second internal flow path 632, it is estimated that the wall loss on the inner circumferential surface of the counterbored portion 65 becomes large, and thus the pressure loss in the second internal flow path 632 increases.

Next, a method of manufacturing the valve element member 6 according to the present embodiment will be described.

First, the concave grooves 61 are formed on the upper surface of the valve element member 6. Machining such as cutting processing is used for this forming. At this time, adhesiveness between a concave surface of the concave groove 61 and the resin layer 62 can be improved by forming the concave surface of the concave groove 61 in a fine uneven shape through roughening processing.

Next, a primer layers is formed by coating the entire upper surface of the valve element member 6 including the concave grooves 61 with polytetrafluoroethylene (PTFE), which is a primer resin. After that, a topcoat layer, which will serve as the resin layer 62, is formed by coating an upper surface of the primer layer with a fluorine-based resin such as PFA several times using thin film coating or other techniques. At this time, a total film thickness of the primer layer and the topcoat layer is set to be a value equal to or larger than the depth (for example, 120 μm) of the concave groove 61.

Then, the primer layer and the topcoat layer formed on the upper surface are polished by polishing processing such as plane lapping. A polishing amount at this time is about 50 μm, for example. That is, not only the primer layer and the topcoat layer formed on the upper surface of the valve element member 6 are polished, but also surrounding portions of the concave grooves 61 (portions remaining as the ridge portions 64) formed on the upper surface of the valve element member 6 are also polished. With this polishing, the resins remain only in the concave grooves 61, and the resins remaining in the concave grooves 61 form the resin layers 62. The surrounding portions of the concave grooves 61 are also polished in this way. Thus, it is possible to avoid excessive polishing of the resin in the concave grooves 61. This polishing method also enables polishing in which the resins in the concave grooves 61 have a uniform film thickness.

Subsequently, the internal flow paths 63 are formed in the valve element member 6 that has undergone polishing processing. Specifically, the internal flow paths 63 are formed by penetrating the ridge portions 64 that is sandwiched between the resin layers 62 formed in annular shapes through cutting processing or the like. As a result, the inflow ports 6p of the internal flow paths 63 are opened in the back surface 6b, and the outflow ports 6q are opened in upper surfaces of the ridge portions 64.

In the present embodiment, the multiple first internal flow paths 631 are formed on an outer circumferential portion of the seating surface 6a, and the multiple second internal flow paths 632 are formed at locations inside of the first internal flow paths 631.

Then, the counterbored portions 65 are formed by counterboring the inflow port 6p sides of the internal flow paths 63. In the present embodiment, the counterbored portions 65 are formed in the second internal flow paths 632 while the counterbored portions 65 are not formed in the first internal flow paths 631. Specifically, each of the counterbored portions 65 having a substantially columnar shape is formed on each inflow port 6p side of the second internal flow paths 632.

Figure 8:
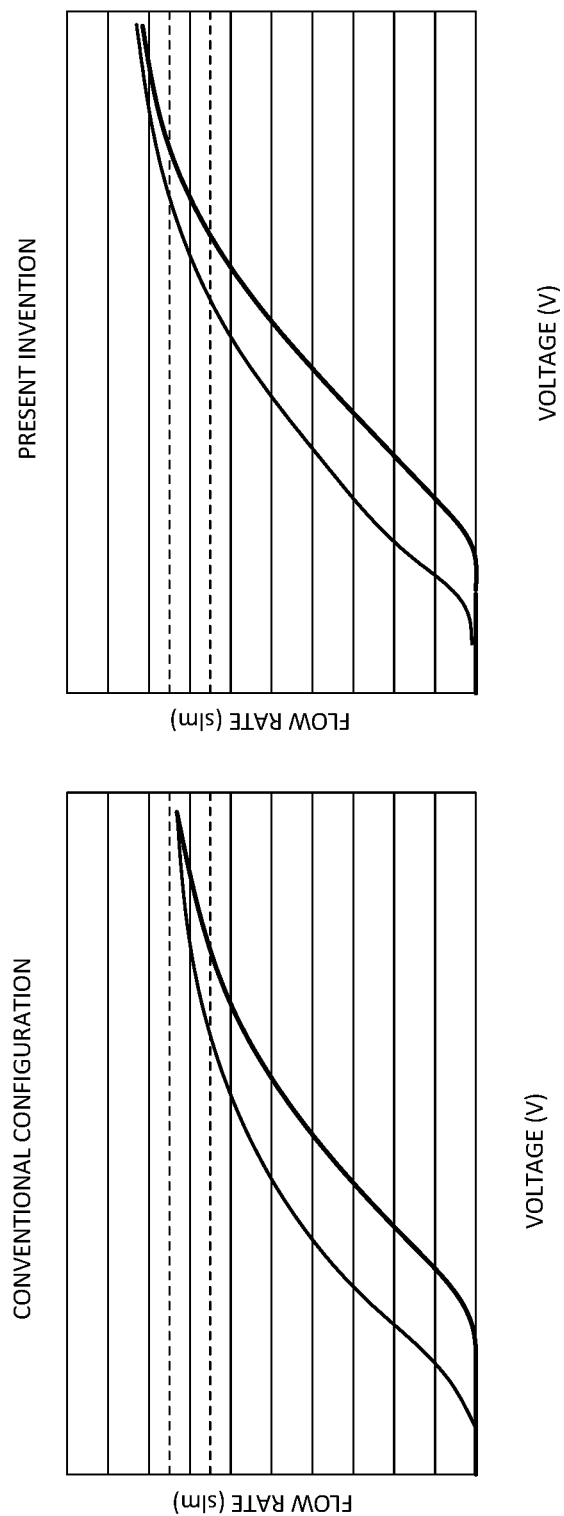
FIG. 8 is a diagram illustrating analysis data that shows another operation and effect brought by the counterbored portion according to the embodiment.
Figure 11:
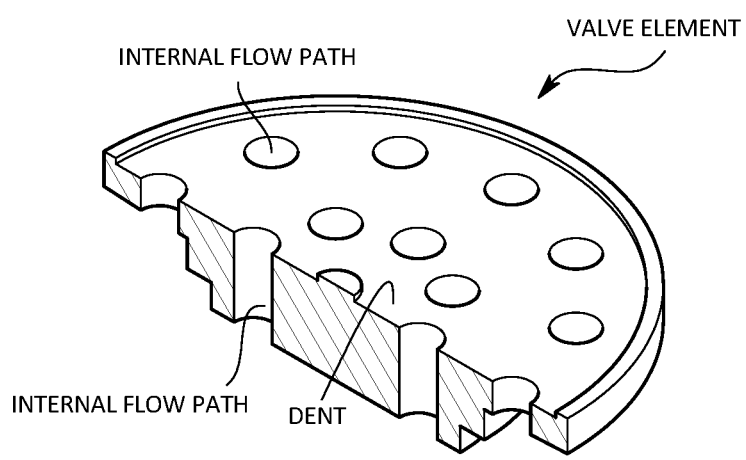
FIG. 11 is a perspective view illustrating a configuration of a conventional valve element.
Figure 12:
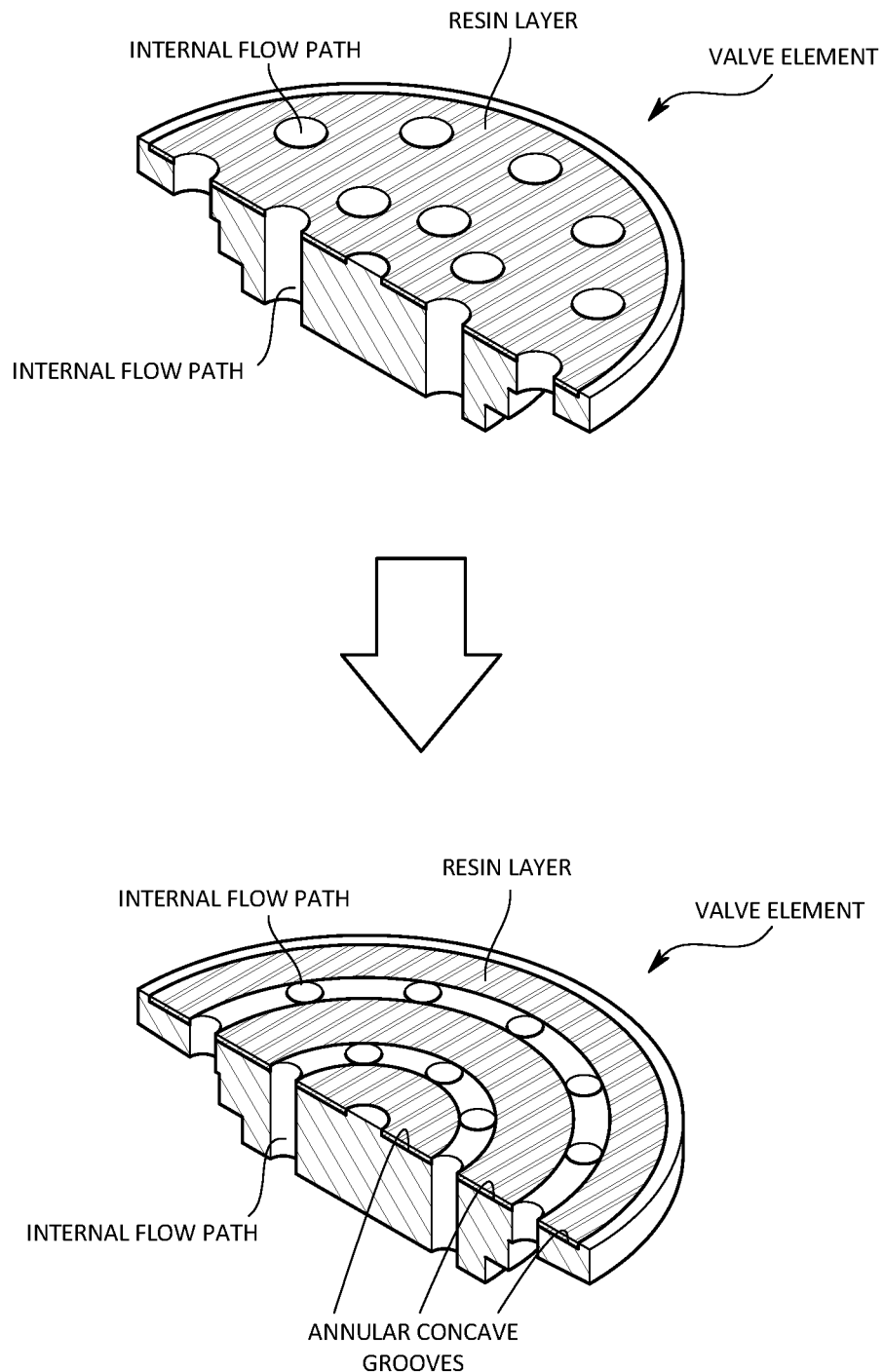
FIG. 12 is a perspective view illustrating a configuration of a valve element studied on an interim basis during development of the present invention.

According to the fluid control valve 3 configured as described above, the internal flow paths 63 formed in the valve element member 6 are opened in the ridge portions 64 around the concave grooves 61 on the facing surface 6x. Thus, it is not necessary to penetrate the resin layers 62 when the internal flow paths 63 are processed. Therefore, it is possible to avoid formation of surface sag. In addition, the counterbored portions 65 are provided on the inflow port 6p sides of this internal flow paths 63. Thus, as illustrated in FIG. 8, the maximum flow rate can be increased, compared to the conventional configuration (specifically, the configuration illustrated in FIG. 11). Further, the resin layers 62 are not provided in the regions, of the facing surface 6x, in which the internal flow paths 63 are opened. Thus, flatness of the regions can be easily achieved, and sealing performance can be also improved.

The counterbored portions 65 are not formed in the first internal flow paths 631, which penetrate the portion around the protrusion portion 6z. Instead, the counterbored portions 65 are formed in the second internal flow paths 632, which penetrate the protrusion portion 6z and have the length longer than that of the first internal flow paths 631. Thus, it is possible to more noticeably exhibit effect, brought by the counterbored portions 65, for reducing the pressure loss while the increases in the processing cost and the man-hours are reduced.

In addition, the internal flow paths 63 have a rotating body shape and the counterbored portions 65 also have a rotating body shape. Thus, processability can be ensured.

Further, the ratio of the length of the counterbored portion 65 to the total length of the internal flow path 63 is 55% or more to 80% or less. Thus, the maximum flow rate can be increased while the number of internal flow paths 63 is suppressed to the conventional number of internal flow paths 63.

The present invention is not limited to the above embodiment.

For example, each of the counterbored portions 65 in the above embodiment is formed so as to individually correspond to each of the second internal flow paths 632. However, a common counterbored portion 65 may be formed which straddles multiple second internal flow paths 632.

Figure 9:
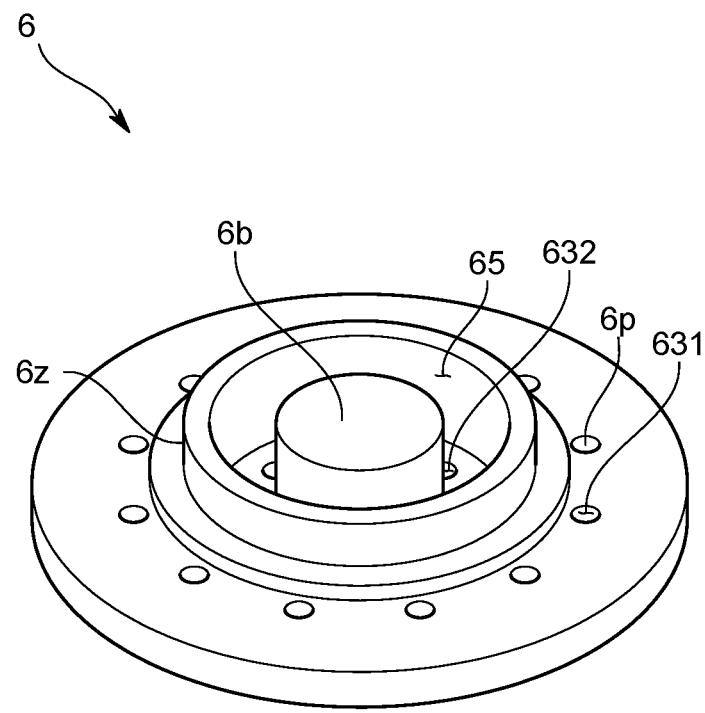
FIG. 9 is a vertical cross-sectional view and a perspective view, as viewed from below, illustrating a valve element according to another embodiment.

Specifically, as illustrated in FIG. 9, an annular counterbored portion 65 may be formed in the protrusion portion 6z. Thus, this common counterbored portion 65 may be provided so as to straddle all of the second internal flow paths 632.

Figure 10:
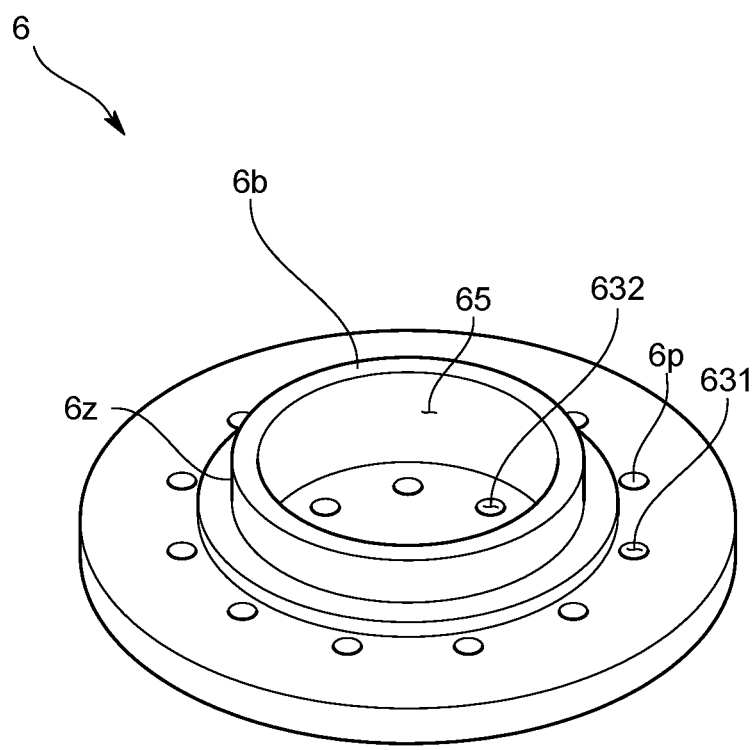
FIG. 10 is a vertical cross-sectional view and a perspective view, as viewed from below, illustrating a valve element according to another embodiment.

In another embodiment, as illustrated in FIG. 10, the common counterbored portion 65 may be formed by wholly counterboring a region, in the protrusion portion 6z, including all of the inflow ports 6p of the second internal flow paths 632. Thus, the common counterbored portion 65 is provided so as to straddle all of the second internal flow paths 632.

Further, the counterbored portions in the above embodiment each have a substantially columnar shape. However, the counterbored portions each may have any of various shapes including a shape in which a diameter is gradually reduced toward the outflow port, as long as the flow path diameter is larger than a diameter of the outflow port side of the internal flow path.

The counterbored portions may be formed in the first internal flow paths as well as in the second internal flow paths.

As internal flow paths, third internal flow paths may be formed in addition to the first internal flow paths and the second internal flow paths. In this case, the third internal flow paths may be formed at locations such as locations radially outside of the first internal flow paths or locations radially inside of the second internal flow paths. Counterbored portions may or may not be provided in the third internal flow paths.

In the above embodiment, the method of manufacturing the valve element member is described. In this method, after the resin layers are provided in the concave grooves, the internal flow paths are formed, and then the counterbored portions are provided. However, a procedure may be designed such that the internal flow paths are initially formed, then the counterbored portions are provided, and subsequently the resin layers are provided in the concave grooves.

The resin layer may be formed of any of various resins including, for example, a polyester resin such as polyamide, polycarbonate, and polybutylene terephthalate (PBT), an epoxy resin, and an unsaturated polyester resin, in addition to a crosslinked modified fluorine-based resin. In a case where these resins are used, to eliminate the need for an adhesive, for example, a reactive functional group is formed using some means such as applying a specific chemical to the surface of the metal base body. Then, the reactive functional group and the resin are chemically bonded by some treatment such as heating.

As the fluorine-based resin, one may be used which is selected from a tetrafluoroethylene copolymer, a tetrafluoroethylene-perfluoro (alkyl vinyl ether) copolymer, a tetrafluoroethylene-hexafluoropropylene copolymer, a tetrafluoroethylene-ethylene copolymer, or a polychlorotrifluoroethylene copolymer, or another one may be used which is a mixture of two or more selected from the copolymers described above.

Further, a part or all of the above embodiment or the modified embodiments may be appropriately combined. The present invention is not limited to the above embodiments, and it goes without saying that the embodiments can be variously modified and combined without departing from the spirit of the present invention.

DESCRIPTION OF REFERENCE CHARACTERS 100 fluid control device
3 fluid control valve
4 valve seat member
6 valve element member
6a seating surface
6b back surface
6z protrusion portion
6x facing surface
61 concave groove
62 resin layer
63 internal flow path
631 first internal flow path
632 second internal flow path
6p inflow port
6q outflow port
64 ridge portion
65 counterbored portion

What is claimed is:

1. A fluid control valve comprising:
a valve seat; and
a valve element including a resin layer provided in a concave groove formed on a facing surface facing the valve seat and a ridge portion surrounding the concave groove on the facing surface,
wherein the valve element further includes at least one internal flow path whose inflow port is opened in a back surface facing away from the facing surface and whose outflow port is opened in the ridge portion, and wherein a counterbored portion is formed on a side of the inflow port of the at least one internal flow path.

2. The fluid control valve according to claim 1,
wherein the valve element includes at least one first internal flow path as the at least one internal flow path, and at least one second internal flow path as the at least one internal flow path, the at least one second internal flow path being longer than the at least one first internal flow path, and
wherein the counterbored portion is not formed in the at least one first internal flow path, and the counterbored portion is formed in the at least one second internal flow path.

3. The fluid control valve according to claim 2,
wherein the back surface of the valve element is provided with a protrusion portion having a thickness dimension larger than a thickness dimension of a portion around the protrusion portion, the thickness dimension being a dimension along a direction orthogonal to the back surface,
wherein the at least one first internal flow path penetrates the portion around the protrusion portion, and
wherein the at least one second internal flow path penetrates the protrusion portion.

4. The fluid control valve according to claim 3, further comprising:
a valve element return spring having an annular shape, the valve element return spring being configured to bias the valve element toward the valve seat,
wherein the protrusion portion is fitted into the valve element return spring.

5. The fluid control valve according to claim 2,
wherein the at least one first internal flow path comprises a plurality of first internal flow paths and the at least one second internal flow path comprises a plurality of second internal flow paths,
wherein the plurality of first internal flow paths is provided and the plurality of second internal flow paths is provided, and
wherein a first plurality of outflow ports of the plurality of first internal flow paths and a second plurality of outflow ports of the plurality of second internal flow paths are concentrically disposed on the facing surface.

6. The fluid control valve according to claim 1,
wherein the counterbored portion has a rotating body shape whose rotational axis passes through centers of the inflow port and the outflow port.

7. The fluid control valve according to claim 1,
wherein the at least one internal flow path comprises a plurality of internal flow paths, and
wherein the counterbored portion that is single is formed in a straddling manner over the plurality of internal flow paths.

8. The fluid control valve according to claim 1,
wherein a ratio of a length of the counterbored portion to a total length of the at least one internal flow path is 55% or more to 80% or less.

9. The fluid control valve according to claim 1,
wherein the resin layer is formed of a crosslinked modified fluorine-based resin.

10. A fluid control device comprising the fluid control valve according to claim 1.

11. A valve element that forms a fluid control valve along with a valve seat, the valve element comprising:
a resin layer provided in a concave groove formed on a facing surface facing the valve seat;
a ridge portion surrounding the concave groove on the facing surface; and
at least one internal flow path whose inflow port is opened in a back surface facing away from the facing surface and whose outflow port is opened in the ridge portion, wherein a counterbored portion is formed on a side of the inflow port of the at least one internal flow path.

12. A method of manufacturing a valve element that forms a fluid control valve along with a valve seat, the method comprising:
forming a concave groove on a facing surface facing the valve seat and a ridge portion surrounding the concave groove on the facing surface;
providing a resin layer in the concave groove;
forming at least one internal flow path whose inflow port is opened in a back surface facing away from the facing surface and whose outflow port is opened in the ridge portion; and
providing a counterbored portion on a side of the inflow port of the at least one internal flow path.

* * * * *